(12) United States Patent
Wang et al.

(10) Patent No.: US 10,704,961 B2
(45) Date of Patent: Jul. 7, 2020

(54) TEMPERATURE MEASURING APPARATUS, ELECTRICAL ASSEMBLY AND BATTERY PACK

(71) Applicants: TYCO ELECTRONICS (SHANGHAI) CO. LTD., Shanghai (CN); TYCO ELECTRONICS TECHNOLOGY (SIP) CO. LTD., Suzhou (CN)

(72) Inventors: Jifa Wang, Suzhou (CN); Xiao Zhou, Shanghai (CN)

(73) Assignees: Tyco Electronics (Shanghai) Co. Ltd., Shanghai (CN); Tyco Electronics (SIP) Co. Ltd., Suzhou (CN)

( * ) Notice: Subject to any disclaimer, the term of this patent is extended or adjusted under 35 U.S.C. 154(b) by 360 days.

(21) Appl. No.: 15/671,843

(22) Filed: Aug. 8, 2017

(65) Prior Publication Data

US 2018/0045576 A1   Feb. 15, 2018

(30) Foreign Application Priority Data

Aug. 12, 2016   (CN) ...................... 2016 2 0876957 U

(51) Int. Cl.
*G01K 1/14*   (2006.01)
*G01K 1/16*   (2006.01)
(Continued)

(52) U.S. Cl.
CPC ................ *G01K 1/14* (2013.01); *G01K 1/16* (2013.01); *G01K 7/16* (2013.01); *H01M 10/482* (2013.01);
(Continued)

(58) Field of Classification Search
CPC .......... H01M 2220/20; H01M 10/482; H01M 10/486; G01K 1/14; G01K 7/16;
(Continued)

(56) References Cited

U.S. PATENT DOCUMENTS

2003/0157399 A1 *   8/2003   Ikeuchi ................... H01C 1/14
429/62
2003/0223474 A1 *   12/2003   Roepke ................... G01K 1/16
374/152
(Continued)

*Primary Examiner* — Lisa M Caputo
*Assistant Examiner* — Janice M Soto
(74) *Attorney, Agent, or Firm* — Saxton & Stump LLC

(57) ABSTRACT

The present disclosure discloses a temperature measuring apparatus, an electrical assembly, and a battery pack. The temperature measuring apparatus comprises a heat transfer element, a temperature measuring device, and a wiring board. The heat transfer element is arranged for being in heat conductive contact with an object to be measured. The temperature measuring device is provided in contact with the heat transfer element and arranged to be spaced from the object to be measured. The temperature measuring device is arranged for detecting a temperature of the object to be measured and may output a temperature signal. The wiring board is electrically connected with the temperature measuring device to receive and transmit the temperature signal outputted by the temperature measuring device. The present disclosure only requires a heat conductive contact between the heat transfer element and the temperature measuring device of the temperature measuring apparatus, thereby facilitating assembly. Compared with insulated isolation with the object to be measured by glue-filling after the single-core wire is connected with the temperature measuring device, the temperature measuring apparatus of the present disclosure greatly reduces the assembly procedures.

17 Claims, 11 Drawing Sheets

(51) Int. Cl.
*G01K 7/16* (2006.01)
*H01M 10/48* (2006.01)
*H05K 1/18* (2006.01)
*H05K 3/34* (2006.01)

(52) U.S. Cl.
CPC .......... *H01M 10/486* (2013.01); *H05K 1/181* (2013.01); *H01M 2220/20* (2013.01); *H05K 3/341* (2013.01); *H05K 2201/10022* (2013.01); *H05K 2201/10151* (2013.01); *H05K 2201/10378* (2013.01)

(58) Field of Classification Search
CPC .......... G01K 1/16; H05K 1/181; H05K 3/341; H05K 2201/10022; H05K 2201/10151; H05K 2201/10378
USPC .................................. 374/29, 39, 137, 44, 5
See application file for complete search history.

(56) References Cited

U.S. PATENT DOCUMENTS

| | | | | |
|---|---|---|---|---|
| 2014/0076524 | A1* | 3/2014 | Boday | F16L 11/00 165/104.33 |
| 2016/0035467 | A1* | 2/2016 | Haydin | H01C 1/02 429/90 |
| 2017/0271642 | A1* | 9/2017 | Groshert | H01M 2/206 |

* cited by examiner

TEMPERATURE MEASURING APPARATUS, ELECTRICAL ASSEMBLY AND BATTERY PACK

FIELD OF THE INVENTION

The present disclosure generally relates to a structure for temperature measurement, and particularly to a temperature measuring apparatus, an electrical assembly, and a battery pack, which may be implemented within an electric vehicle.

BACKGROUND OF THE INVENTION

With increasingly wide application of new energy sources, electric vehicles become more and more popular among consumers. A battery pack is a power source of an electric vehicle, the stable operation of the battery pack is critical to the vehicle's safety performance. The vehicular battery pack outputs a relatively large current when working, which easily causes temperature rise. Usually, it is needed to monitor operation parameters of the battery pack so as to guarantee driving safety of a vehicle. The current outputted by the battery pack and the temperature thereof are parameters that need to be particularly monitored. In the prior art, current and temperature signals of the vehicular battery pack are usually transmitted in a throwing line mode (i.e., a single-core wire connection). When it is needed to simultaneously detect a plurality of battery cells in the vehicular battery pack, such a single-core wire connection will very easily cause a messy wiring, occupying the narrow mounting environment within the vehicular battery pack. In addition, such a single-core line is easily worn, causing short-circuit issues. Further, the means for stably connecting the single-core wire with a temperature measuring device for measuring temperature is rather complex, incurring a higher manufacturing cost.

SUMMARY OF THE INVENTION

To overcome the deficiencies in the prior art, one of the objectives of the present disclosure is to provide a temperature measuring apparatus, an electrical assembly, and a battery pack, which are convenient to assemble, safe and stable in performance.

To achieve the above objectives, the present utility model is implemented through the following technical solutions:

The present disclosure provides a temperature measuring apparatus. The temperature measuring apparatus comprises a heat transfer element, a temperature measuring device, and a wiring board. The heat transfer element is arranged for being in heat conductive contact with an object to be measured. The temperature measuring device is provided in contact with the heat transfer element and arranged to be spaced from the object to be measured. The temperature measuring device is arranged for detecting temperature of the object to be measured and may output a temperature signal. The wiring board is electrically connected with the temperature measuring device to receive and transmit the temperature signal outputted by the temperature measuring device.

Preferably, the wiring board has a connection portion protruding in a width direction; the heat transfer element and the temperature measuring device are disposed on the connection portion.

Preferably, an observation hole is extended through the connection portion in a thickness direction; and the observation hole and the heat transfer element are arranged to directly face each other.

Preferably, at least two observation holes are provided, the at least two observation holes being sequentially arranged along a protruding direction of the connection portion; and all observation holes are arranged to directly face the heat transfer element.

Preferably, the wiring board is a rigid printed circuit board or a flexible printed circuit board.

Preferably, the temperature measuring device and the wiring board are connected by SMT (surface-mount technology) soldering.

Preferably, the heat transfer element is a heat conductive silicon gel pad.

Preferably, the heat transfer element is an integral element made of a self-adhesive silicon gel material.

Preferably, the heat transfer element is arranged to be deformed when being pressed by the temperature measuring device to thereby form a recess that receives the temperature measuring device.

Preferably, the temperature measuring device is provided in contact with a bottom wall and a side wall of the recess.

Preferably, an upper surface of the heat transfer element and an upper surface of the temperature measuring device are co-planarly provided.

Preferably, the temperature measuring device is a thermosensitive resistor.

Preferably, the temperature measuring device is an SMD resistor and connected with the wiring board by soldering.

Preferably, the temperature measuring device is a negative temperature coefficient thermosensitive resistor.

The present disclosure further provides an electrical assembly. The electrical assembly comprises an object to be measured and a temperature measuring apparatus according to any one of the above mentioned. The heat transfer element and the object to be measured are provided in heat conductive contact.

Preferably, the temperature measuring device and the object to be measured are insulated.

Preferably, the temperature measuring device and the object to be measured are insulated through the heat transfer element.

Preferably, a lower surface of the heat transfer element and an upper surface of the object to be measured are provided in contact.

Preferably, an upper surface of the heat transfer element and a lower surface of the wiring board are provided in contact.

Preferably, the heat transfer element is provided to be deformed under pressure between the wiring board and the object to be measured.

Preferably, the electrical assembly further comprises a lead frame; and the wiring board and the object to be measured are provided on the lead frame, respectively.

Preferably, the object to be measured is a bus-bar for being connected with battery cells.

Preferably, the bus-bar is electrically connected with the wiring board.

The present disclosure further provides a battery pack, comprising a plurality of battery cells and an electrical assembly according to any one of the above mentioned, the battery cells being electrically connected to the object to be measured.

Compared with the prior art, the present disclosure only requires a heat conductive contact between the heat element and the temperature measuring device of the temperature measuring apparatus, thereby facilitating assembly. Compared with insulated isolation with the object to be measured achieved by glue-filling after the single-core wire is connected with the temperature measuring device, the temperature measuring apparatus of the present disclosure greatly reduces the assembly procedures.

Preferably, the heat transfer element employs a heat conductive silicon gel pad, which not only achieves a superb heat conductive performance, but also achieves an insulation performance. Further, the heat transfer element is made of a self-adhesive silicon gel, which may facilitate assembling, fitting or contacting with other components. The temperature measuring apparatus uses a wiring board, instead of the throwing line connection approach, to transmit current and temperature signals, thereby improving the transmission performance and making the layout reasonable and orderly.

BRIEF DESCRIPTION OF THE ACCOMPANYING DRAWINGS

DETAILED DESCRIPTION OF THE PREFERRED EMBODIMENTS

Hereinafter, the present disclosure will be described in detail with reference to the accompanying drawings:

Embodiment I

Figure 1:
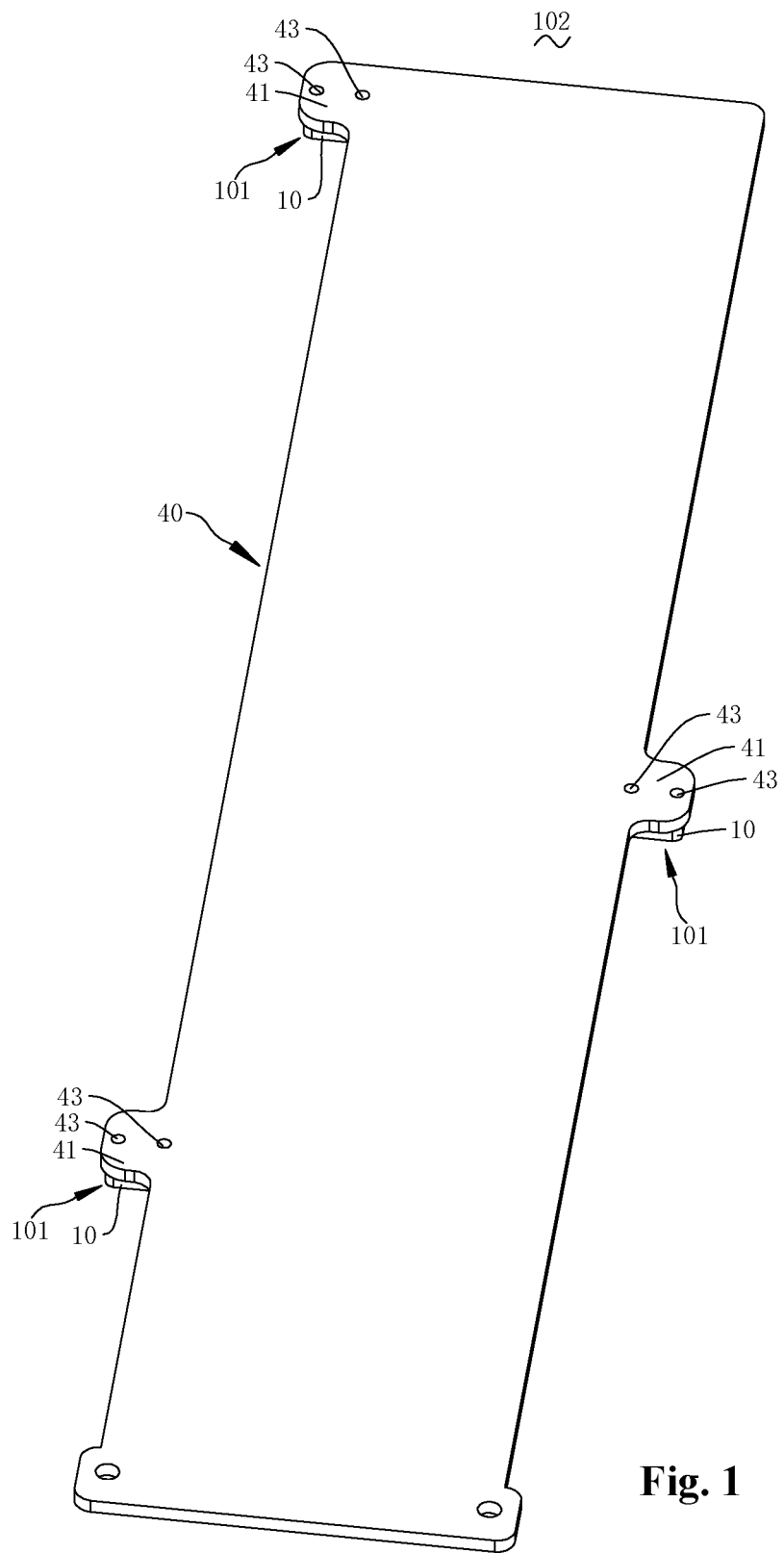
FIG. 1 is a structural diagram of a temperature measuring apparatus provided on an upper surface of a wiring board according to the present disclosure.
Figure 2:
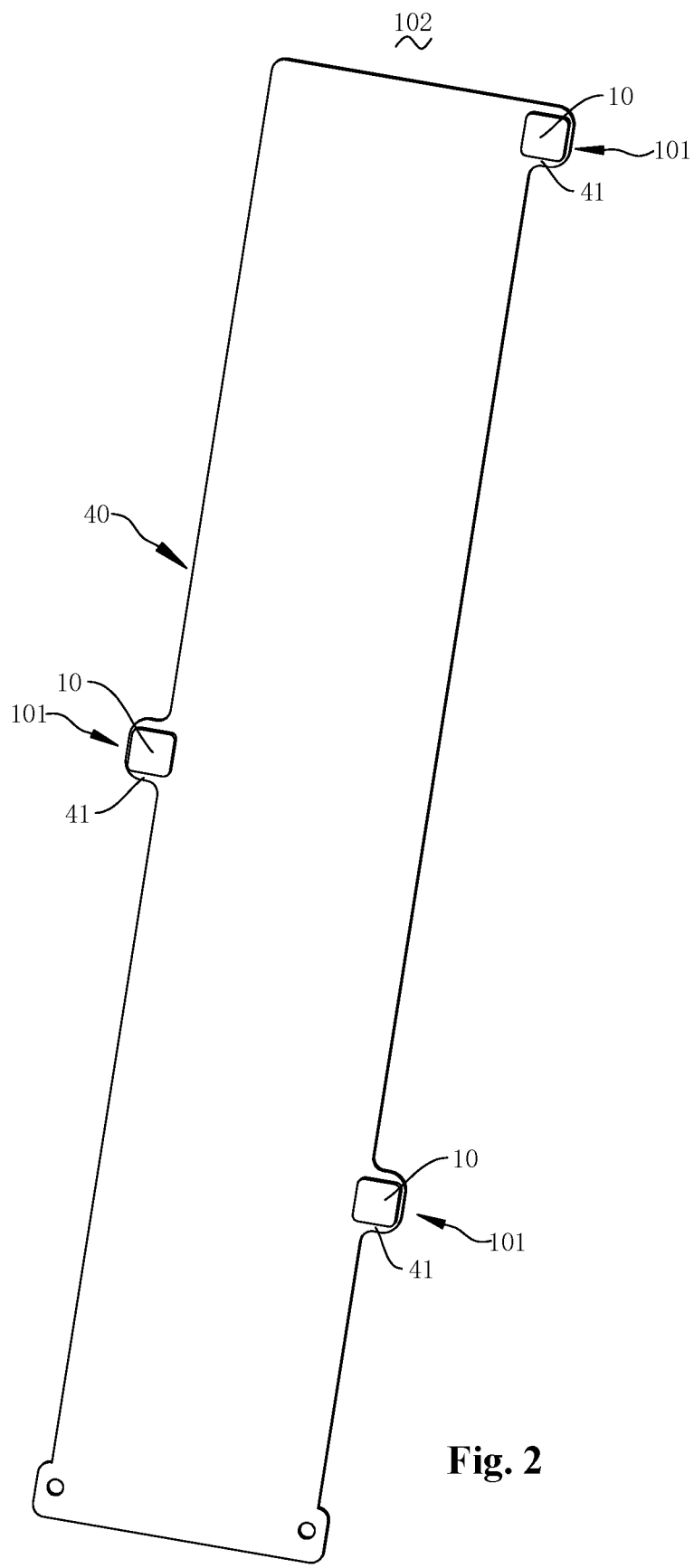
FIG. 2 is a structural diagram of the temperature measuring apparatus of FIG. 1, showing a lower surface of the wiring board.

Refer to FIG. 1 and FIG. 2, where a temperature measuring apparatus 102 provided by the present disclosure is shown. The temperature measuring apparatus 102 comprises a wiring board 40 and a temperature measuring assembly 101. The wiring board 40 and the temperature measuring assembly 101 are electrically connected.

Figure 3:
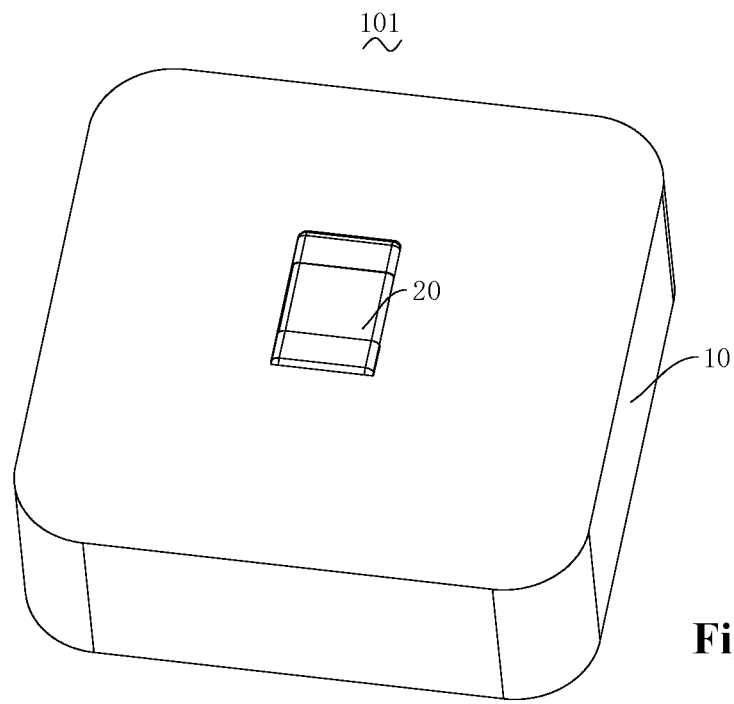
FIG. 3 is a structural diagram of the temperature measuring assembly of FIG. 1.
Figure 4:
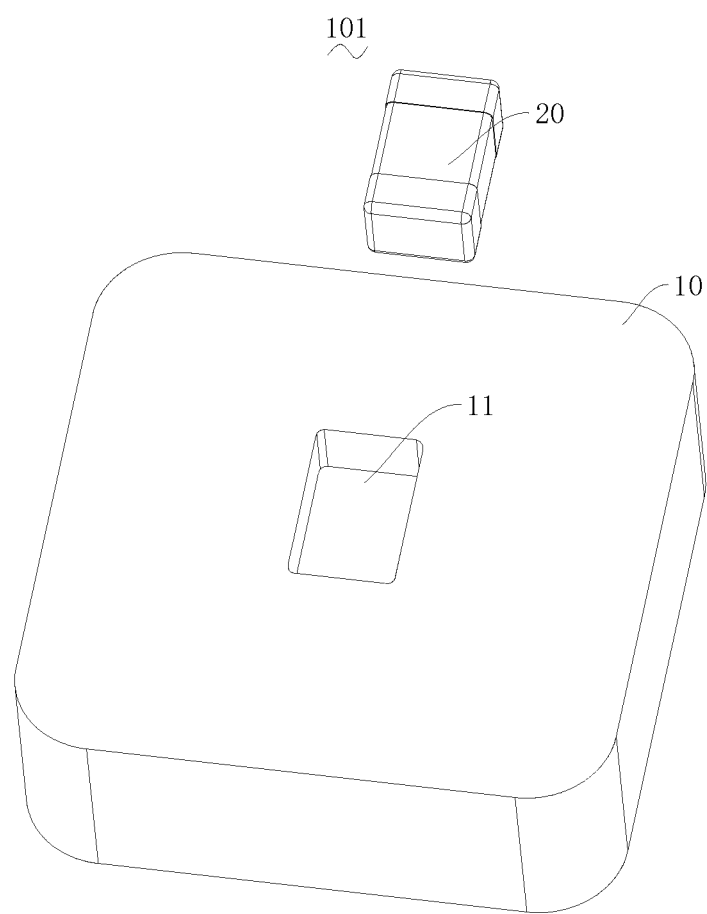
FIG. 4 is an exploded perspective diagram of the temperature measuring assembly of FIG. 3.

Refer to FIG. 3 and FIG. 4, the temperature measuring assembly 101 comprises a heat transfer element 10 and a temperature measuring device 20. The heat transfer element 10 is in heat conductive contact with an object 50 to be measured that will be described infra. The temperature measuring device 20 is in contact with the heat transfer element 10 and arranged to be spaced from the object 50 to be measured.

Figure 5:
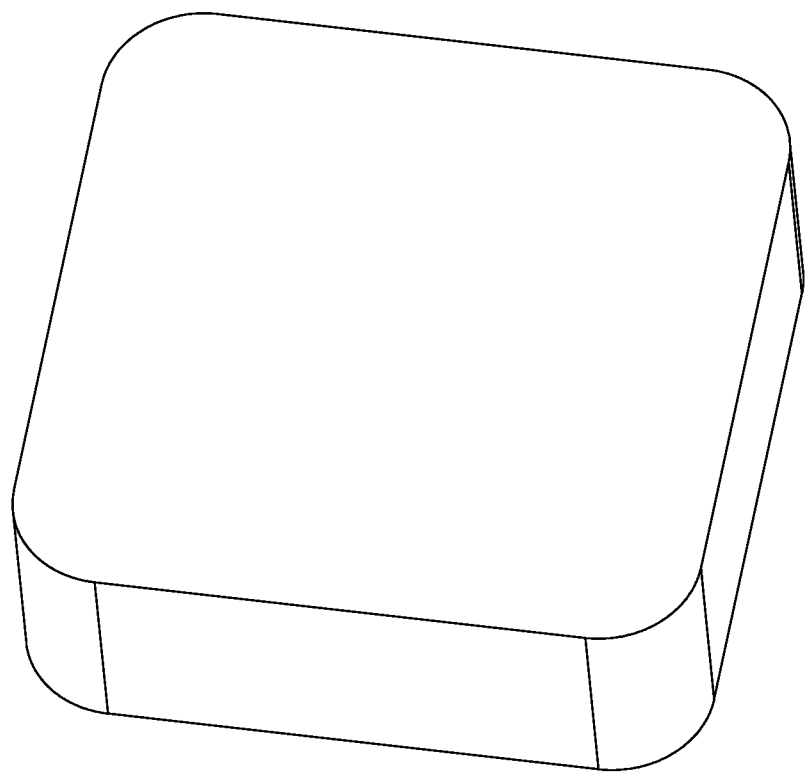
FIG. 5 is a structural diagram as shown in FIG. 3 when the heat transfer element is not deformed.

Referring to FIG. 5 in combination, the heat transfer element 10 is arranged for being in heat conductive contact with the object 50 to be measured. It may be envisaged that upon reaching a heat balance, the heat transfer element 10 has a same temperature as the object 50 to be measured, thereby facilitating the temperature measuring device 20 to indirectly measure the temperature of the object 50 to be measured by directly measuring the temperature of the heat transfer 10. It is only required that the shape and structure of the heat transfer element 10 may conduct heat and that the temperature measuring device 20 be spaced from the object 50 to be measured. In order to improve measurement precision, the heat transfer element 10 is made of an insulative material. In the present embodiment, in order to achieve good heat conduction, insulation, and save space, the heat transfer element 10 is a heat conductive silicon gel pad. It may be envisaged that the heat conductive silicon gel pad may be referred to as a heat conductive silicon gel sheet, a heat conductive silica gel pad or a soft heat dissipation pad, etc. To implement a convenient and secure assembly and fitting, the heat transfer element 10 is made of a self-adhesive silicon gel material. To facilitate saving space and form a steady contact, the heat transfer element 10 is provided to be deformed when being pressed by the temperature measuring device 20 to thereby form a recess 11 for receiving the temperature measuring device 20. In the present embodiment, the recess 11 is formed on an upper surface of the heat transfer element 10. To further reduce thermal resistance so as to obtain a better heat conduction performance, the recess 11 of the heat transfer element 10 is arranged such that the temperature measuring device 20 is in contact with a bottom wall and a side wall of the recess 11. To sufficiently utilize the mount space, when the temperature measuring device 20 is received in the recess 11, an upper surface of the heat transfer element 10 and an upper surface of the temperature measuring device 20 are co-planarly disposed. In the present embodiment, the heat transfer element 10 is of a substantially oblong plate shape when not deformed. As needed, plastic deformation or elastic deformation may occur to the heat transfer element 10.

Please continue referring to FIG. 3 and FIG. 4, the temperature measuring device 20 is for directly measuring a temperature of the heat transfer element 10, thereby indirectly obtaining a temperature of the object 50 to be measured. The temperature measuring device 20 may be a thermosensitive element, which may convert the measured temperature into a corresponding temperature signal to output. In the present embodiment, in order to facilitate transfer of the temperature signal, the temperature measuring device 20 is a thermosensitive resistor to convert the measured temperature into an electrical signal. To efficiently achieve a secure connection between the temperature measuring device 20 and a wiring board 40 that will be described infra, the temperature measuring device 20 is an SMD (surface-mount device) thermosensitive resistor. The temperature measuring device 20 and the wiring board 40 are electrically connected by wave soldering. To improve measurement precision, the temperature measuring device 20 is a negative temperature coefficient (NTC) thermosensitive resistor. Specific parameters and specifications of the temperature measuring device 20 are selected as needed. In the present embodiment, the temperature measuring device 20 is pressed by the wiring board 40, causing the heat transfer element 10 to form a recess 11. The temperature measuring device 20 is in contact with the bottom wall and the side wall of the recess 11. The temperature measuring device 20, when being pressed, moves to a position to make the upper surface of the temperature measuring device 20 to be co-planar with the upper surface of the heat transfer element 10.

Figure 6:
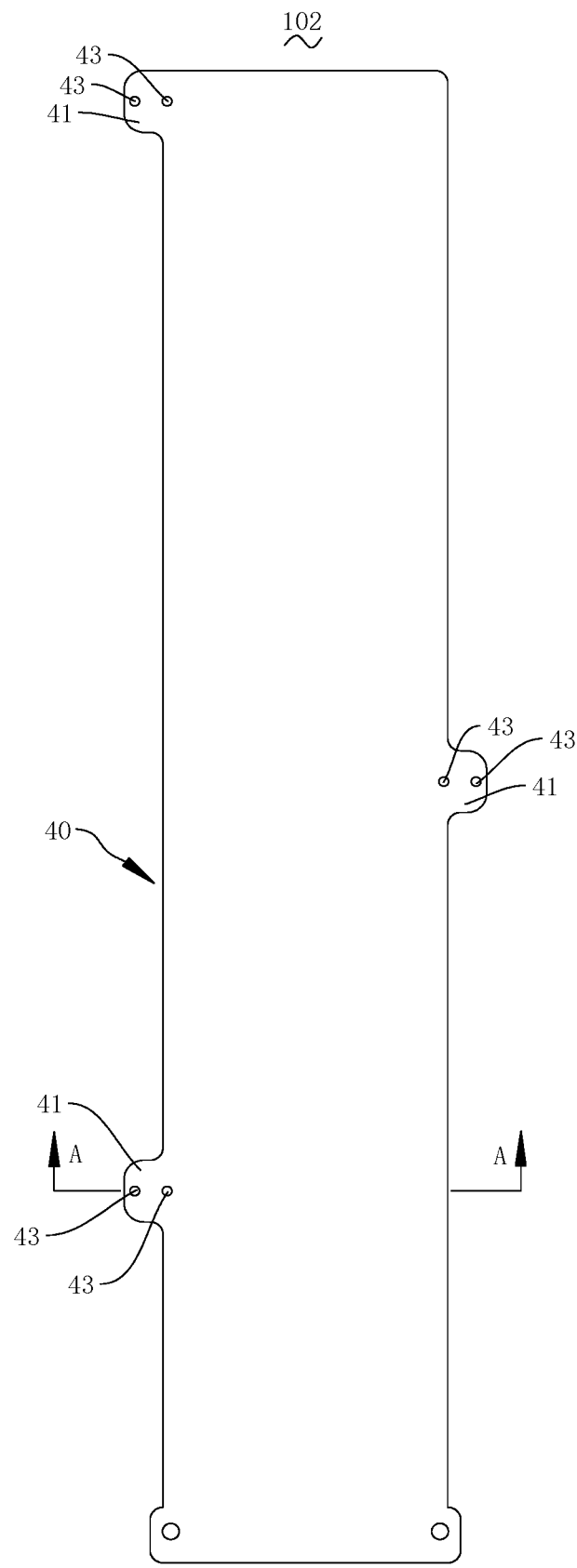
FIG. 6 is a front view of the temperature measuring apparatus of FIG. 1.
Figure 7:
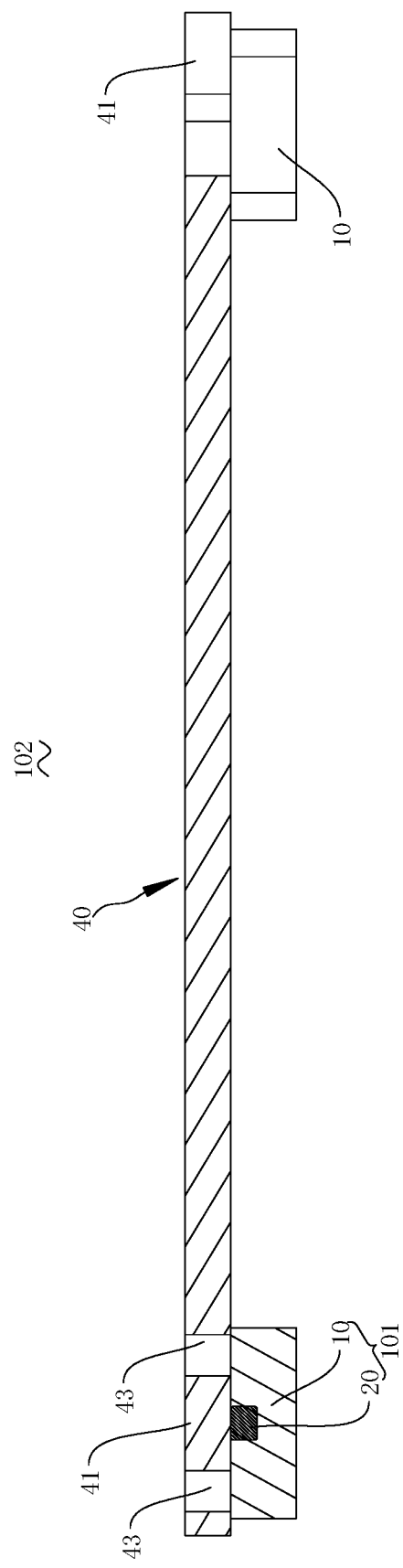
FIG. 7 is a sectional view of the temperature measuring apparatus of FIG. 6 along line A-A.
Figure 8:
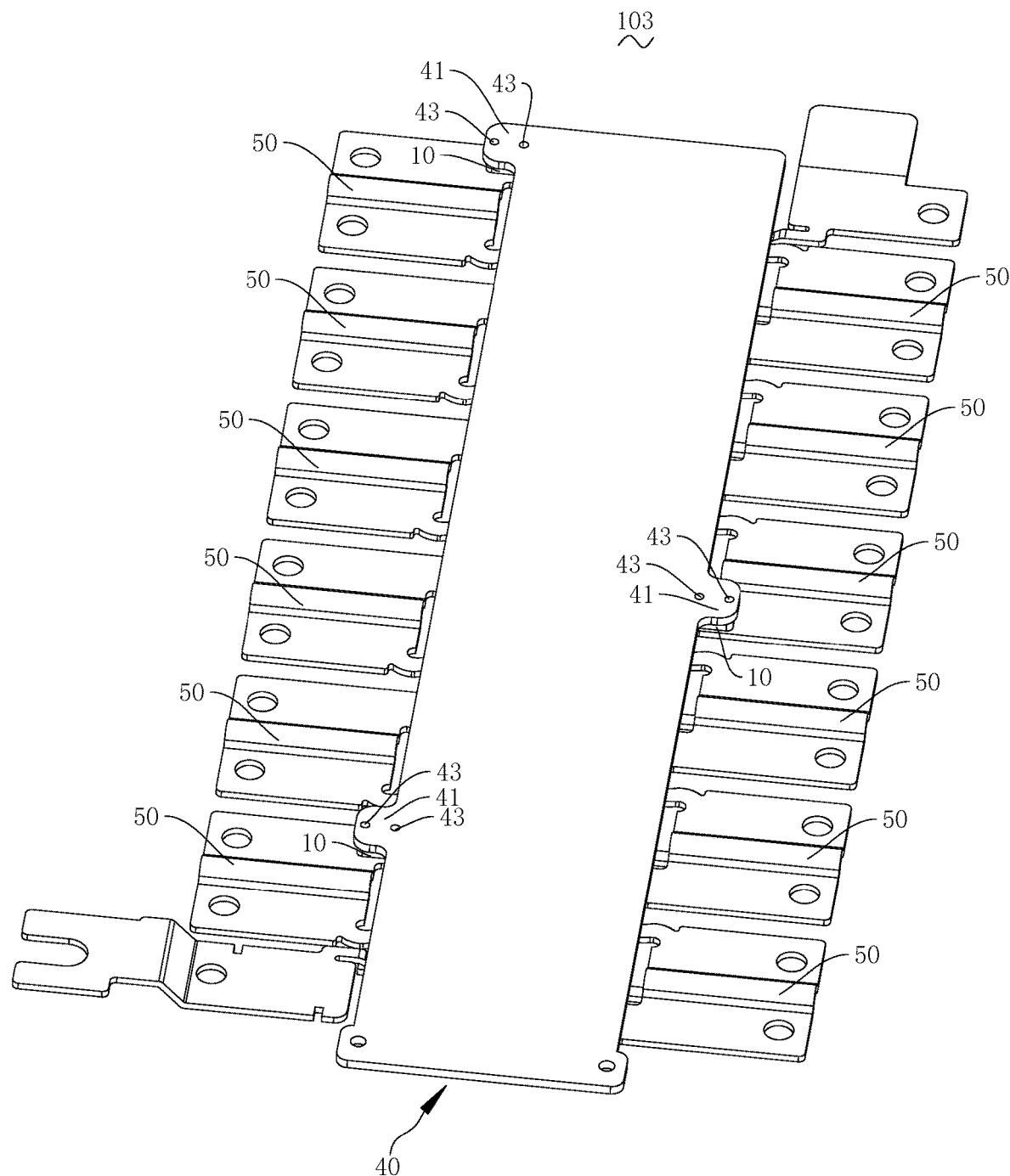
FIG. 8 is a structural diagram of an embodiment of an electrical assembly of the present disclosure.
Figure 9:
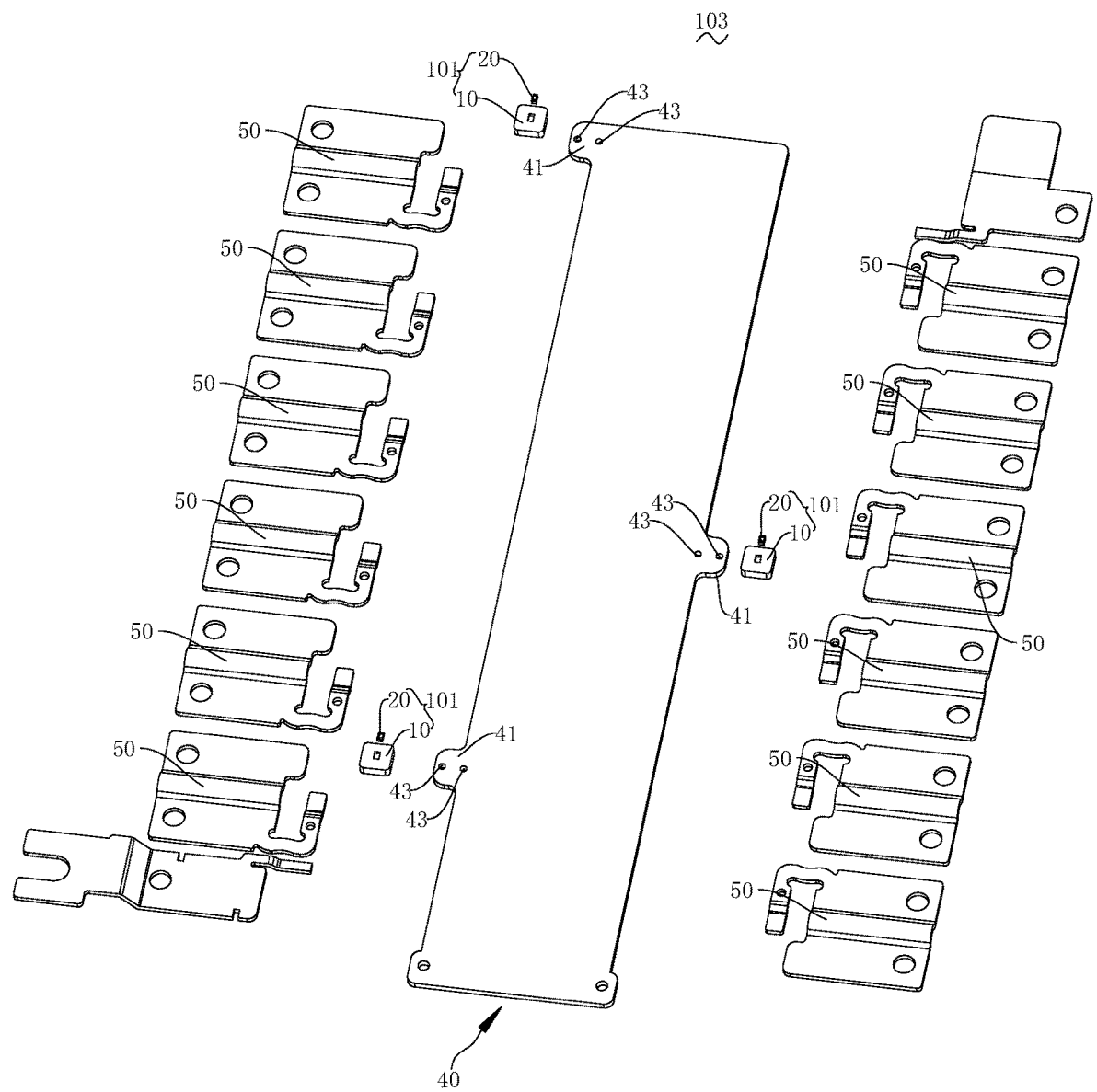
FIG. 9 is an exploded perspective diagram of the electrical assembly of FIG. 8
Figure 10:
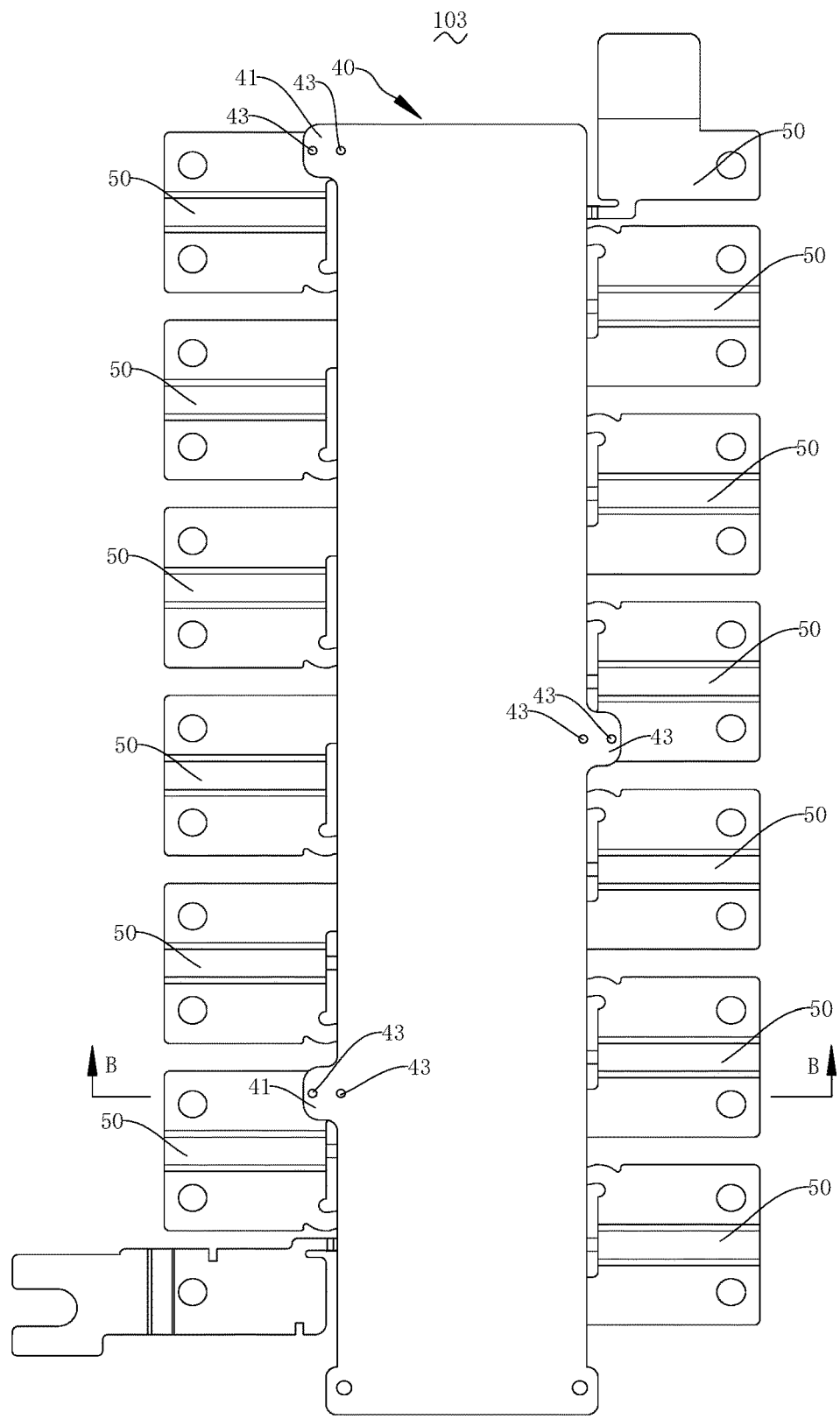
FIG. 10 is a front view of the electrical assembly of FIG. 8.
Figure 11:
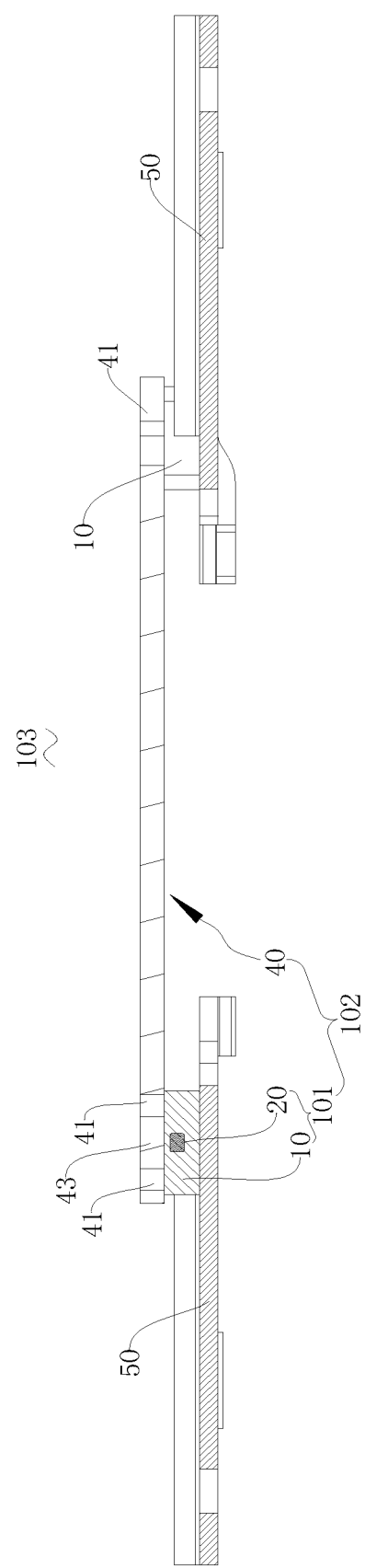
FIG. 11 is a sectional view of the electrical assembly of FIG. 10 along line B-B.

Please refer to FIG. 6 and FIG. 7 in combination, the wiring board 40 is also referred to as a circuit board or a printed circuit board (PCB). Further, to improve the carrying performance of the wiring board 40, the wiring board 40 is a rigid printed circuit board. It may be understood that the rigid printed circuit board is an contrast concept to a flexible printed circuit board. The wiring board 40 is for transmitting a temperature signal and other forms of electrical signal or current. The shapes and specifications of the wiring board 40 are selected according to connection needs. In the present embodiment, the wiring board 40 is of a substantially elongated plate shape. As needed, the wiring board 40 may be an FPCB (Flexible Printed Circuit Board). In the present embodiment, the wiring board 40 may also be electrically connected with an object 50 to be measured which will be described infra so as to transmit other forms of electrical signal or current.

To facilitate forming a stable connection with the temperature measuring device 20, the wiring board 40 has a connection portion 41 protruding in a width direction. The connection portion 41 is connected with the temperature measuring device 20. The connection portion 41 can be any configuration as long as it facilitates connection to the temperature measuring device 20. In the present embodiment, the connection portion 41 is substantially a rectangular plate shape with fillet. The number of connection portions and the specific positions thereof are selected according to the corresponding temperature measuring device 20. In the present embodiment, three connection portions 41 are provided. The three connection portions 41 are substantially located at vertexes of an acute triangle.

To facilitate conforming the accuracy of the mount positions of the heat transfer element 10, an observation hole 43 is extended through the connection portion 41 in a thickness direction. The observation hole 43 is arranged to directly face the heat transfer element 10. In other words, it is only required to observe the heat transfer element 10 via the observation hole 43. To enhance the mounting accuracy, at least two observation holes 43 are provided. The at least two observation holes 43 are arranged sequentially along a protruding direction of the connection portion 41. All observation holes 43 are arranged to directly face the heat transfer element 10. In the present embodiment, two observation holes 43 are provided on each of the connection portions 41.

To facilitate transportation of the entirety and improve the security, the wiring board 40 is provided on a lead frame 60 which will be described infra.

Embodiment II

Please refer to FIGS. 8-11, where an electrical assembly 103 provided by the present disclosure is shown. The electrical assembly 103 comprises an object 50 to be measured and the temperature measuring apparatus 102 as disclosed in Embodiment 2. The heat transfer element 10 is in heat conductive contact with the object 50 to be measured.

The object 50 to be measured is selected according to application needs. The object 50 to be measured may be an electronic product. In the present embodiment, the object 50 to be measured is a bus-bar. The bus-bar may transmit a relatively large current and thus has a relatively large calorific capacity. In the present embodiment, the bus-bar is arranged for connecting batteries in the battery pack in a vehicle. Specific specifications and parameters of the bus-bar are selected according to application needs. To sufficiently save mounting space and reduce thermal resistance for improving precision and speed of measurement, an upper surface of the object 50 to be measured is provided in contact with a lower surface of the heat transfer element 10.

To facilitate transportation and enhance safety, in the present embodiment, the object 50 to be measured is provided on a lead frame 60 which will be described below. The number of the objects 50 to be measured and the manner of arranging the same are selected according to application needs. In the present embodiment, the objects 50 to be measured are divided into two rows. The two rows of the objects to be measured are provided at two sides of the wiring board 40, respectively, each row comprising a plurality of the objects 50 to be measured. To facilitate transmission of an electrical signal or current, the objects 50 to be measured are electrically connected to the wiring board 40 in the present embodiment.

Embodiment III

Figure 12:
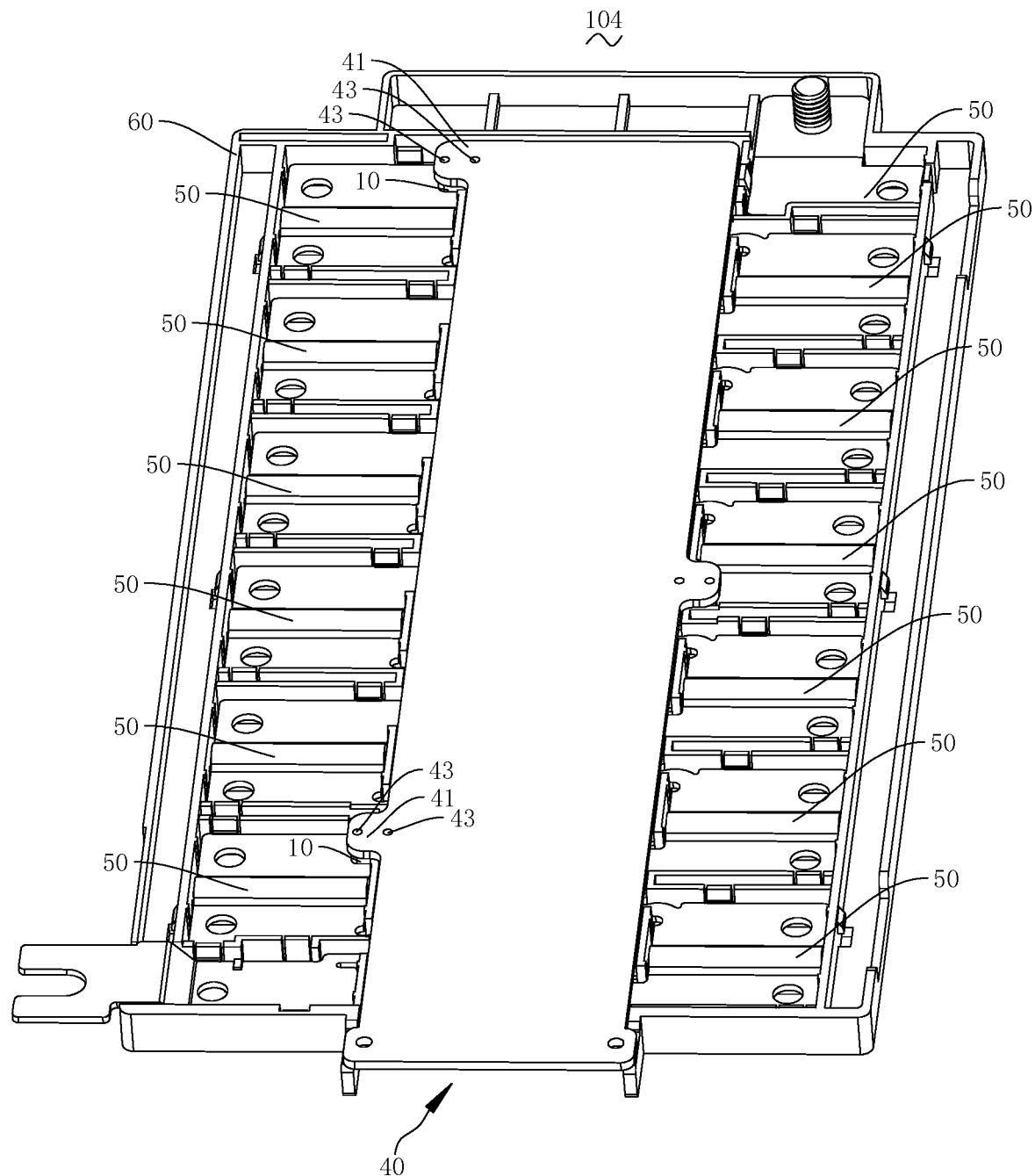
FIG. 12 is a structural diagram of another embodiment of the electrical assembly of the present disclosure.

Please refer to FIG. 12, in which an electrical assembly 104 of another embodiment provided by the present disclosure is shown. Compared with Embodiment II, the electrical assembly 104 further comprises a lead frame 60. The electrical assembly 103 of Embodiment III is provided on the lead frame 60.

The lead frame 60 is arranged for supporting the object 50 to be measured and the wiring board 40. The lead frame 60 is substantially of an elongated plate shape. The lead frame 60 and the wiring board 40 are arranged to extend along a same direction. The lead frame 60 can be any shape and structure as long as they satisfy relevant needs. In the present embodiment, in order to facilitate electrical connection between the object 50 to be measured and a battery which will be described below, the lead frame 60 is provided with a connection through-hole.

In the present embodiment, the wiring board 40 is provided in a middle portion of the lead frame 60. Two rows of the objects 50 to be measured are provided on two sides of the wiring board 40, respectively. Correspondingly, the two rows of the objects 50 to be measured and the lead frame 60 are arranged to extend in the same direction. The objects 50 to be measured are arranged to directly face the connection through-hole to achieve an electrical connection with the battery described below.

Embodiment IV

The present disclosure further provides a battery pack (not shown in the figure). The battery pack is arranged for powering an electric vehicle. The battery pack includes battery cells (not shown) and the electrical assembly 104 disclosed in Embodiment IV.

The battery cells and the objects 50 to be measured are electrically connected in one-to-one relation. The signals and types of the battery cells are selected according to application needs. It may be understood that the battery cells are just individual batteries within the battery pack. In the present embodiments, the battery cells are electrically connected to the bus-bar in one-to-one relation.

It needs to be noted that in the terms "upper" and "lower" appearing in the present disclosure are relative concepts. Specifically, the "upper surface of the wiring board 40" appearing in the present disclosure refers to its soldering face; the "lower surface of the wiring board 40" refers to an element face. In the embodiment, the lower surface of the wiring board 40 directly faces the upper surface of the heat transfer element 10; the lower surface of the heat transfer element 10 directly faces the upper surface of the temperature-to-be-measured object 50; the lower surface of the temperature-to-be-measured object 50 directly faces a top of the lead frame 60; and a bottom end of the lead frame 60 directly faces a main portion of the battery.

What have been described above are only preferred embodiments of the present disclosure, not for limiting the protection scope of the present disclosure. Any modifications, equivalent substitutions or improvements within the spirit of the present disclosure should be included within the scope of the claims of the present disclosure.

What is claimed is:

1. A temperature measuring apparatus for measuring the temperature of an object, comprising:
    a deformable heat transfer element arranged for being in heat conductive contact with the object to be measured, the heat transfer element being made of electrically insulative and thermally conductive material;
    a temperature measuring device provided in contact with the heat transfer element and arranged to be spaced from the object to be measured, the temperature measuring device is arranged for directly measuring the temperature of the heat transfer element, thereby indirectly obtaining a temperature of the object to be measured and outputting a temperature signal based on the indirect temperature of the object; and
    a wiring board electrically connected with the temperature measuring device to receive and transmit the temperature signal outputted by the temperature measuring device; and
    a bus-bar mounted on to the wiring board to be in direct thermal contact with the heat transfer element.

2. The temperature measuring apparatus according to claim 1, wherein the wiring board has a connection portion protruding in a width direction; and the heat transfer element and the temperature measuring device are disposed on the connection portion.

3. The temperature measuring apparatus according to claim 2, wherein an observation hole is extended through the connection portion in a thickness direction; and the observation hole and the heat transfer element are arranged to directly face each other.

4. The temperature measuring apparatus according to claim 3, wherein the observation hole comprises at least two observation holes, the two observation holes being sequentially arranged along a protruding direction of the connection portion; and all observation holes are arranged to directly face the heat transfer element.

5. The temperature measuring apparatus according to claim 1, wherein the wiring board is a rigid printed circuit board or a flexible printed circuit board.

6. The temperature measuring apparatus according to claim 1, wherein the temperature measuring device and the wiring board are connected by surface-mount technology soldering.

7. The temperature measuring apparatus according to claim 1, wherein the heat transfer element is a heat conductive silicon gel pad.

8. The temperature measuring apparatus according to claim 7, wherein the heat transfer element is an integral element made of a self-adhesive silicon gel material.

9. The temperature measuring apparatus according to claim 1, wherein the temperature measuring device is a thermosensitive resistor.

10. The temperature measuring apparatus according to claim 9, wherein the temperature measuring device is a surface mounted device resistor and connected with the wiring board by soldering.

11. An electrical assembly, comprising the temperature measuring apparatus according to claim 1 and a lead frame supporting the temperature measuring apparatus; wherein the wiring board is mounted on the lead frame.

12. The electrical assembly according to claim 11, wherein a lower surface of the heat transfer element and an upper surface of the object to be measured are provided in contact.

13. The electrical assembly according to claim 11, wherein an upper surface of the heat transfer element and a lower surface of the wiring board are provided in contact.

14. The electrical assembly according to claim 13, wherein the heat transfer element is provided to be deformed under pressure between the wiring board and the object to be measured.

15. A temperature measuring apparatus for measuring the temperature of an object, comprising:
    a heat transfer element arranged for being in heat conductive contact with the object to be measured;
    a circuit board is mounted on a lead frame which supports the temperature measuring apparatus;
    a bus-bar mounted on the lead frame and in direct thermal contact with the heat transfer element;
    wherein a temperature measuring device provided in contact with the heat transfer element and arranged to be spaced from the object to be measured, the temperature measuring device is arranged for directly measuring the temperature of the heat transfer element, thereby indirectly obtaining a temperature of the object to be measured and outputting a temperature signal based on the indirect temperature of the object to the circuit board; and
    wherein the heat transfer element is arranged to be deformed when being pressed by the temperature measuring device to form a recess that receives the temperature measuring device.

16. The temperature measuring apparatus according to claim 15, wherein the temperature measuring device is provided in contact with a bottom wall and a side wall of the recess.

17. The temperature measuring apparatus according to claim 15, wherein the surface of the heat transfer element and a surface of the temperature measuring device are co-planarly provided.

* * * * *